(12) United States Patent
Li

(10) Patent No.: US 8,188,502 B2
(45) Date of Patent: May 29, 2012

(54) LIGHT EMITTING DEVICE WITH PHOSPHOR WAVELENGTH CONVERSION

(75) Inventor: Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

(21) Appl. No.: 13/073,395

(22) Filed: Mar. 28, 2011

(65) Prior Publication Data

US 2011/0170277 A1 Jul. 14, 2011

Related U.S. Application Data

(63) Continuation of application No. 11/975,130, filed on Oct. 17, 2007, now Pat. No. 7,915,627.

(51) Int. Cl.
*H01L 21/30* (2006.01)

(52) U.S. Cl. ...... 257/98; 257/99; 257/100; 257/E33.061

(58) Field of Classification Search ............... 257/98, 257/99, 100, E33.061, 101, 102, 103
See application file for complete search history.

(56) References Cited

U.S. PATENT DOCUMENTS

| | | | |
|---|---|---|---|
| 5,998,925 A * | 12/1999 | Shimizu et al. | ............... 313/503 |
| 6,084,250 A | 7/2000 | Justel et al. | |
| 6,350,041 B1 | 2/2002 | Tarsa et al. | |
| 2006/0028122 A1 | 2/2006 | Wang et al. | |
| 2006/0145123 A1 | 7/2006 | Li et al. | |
| 2006/0158090 A1 | 7/2006 | Wang et al. | |
| 2006/0261309 A1 | 11/2006 | Li et al. | |
| 2007/0029526 A1 | 2/2007 | Cheng et al. | |
| 2007/0228931 A1 * | 10/2007 | Kim et al. | ............ 313/501 |

FOREIGN PATENT DOCUMENTS

WO 2004100226 11/2004

* cited by examiner

*Primary Examiner* — Thinh T Nguyen
(74) *Attorney, Agent, or Firm* — Fliesler Meyer LLP

(57) ABSTRACT

A light emitting device comprises an excitation source (20), one or more light emitting diode(s) operable to generate excitation light of a first wavelength range ($\lambda_1$) and a light emitting surface (14) having a phosphor material (26) which absorbs at least a part of the excitation light and emits light of a second wavelength range ($\lambda_2$), wherein light (32) emitted by the device comprises combined light of the first and second wavelength ranges emitted by the light emitting surface. The device is characterized by the light emitting surface having one or more window areas (28) which does not include a phosphor material and which are substantially transparent to light of the first and second wavelengths. The light emitting surface can comprise a transparent substrate (14) having a pattern of phosphor material on a surface thereof with the one or more window areas evenly distributed over the light emitting surface.

17 Claims, 10 Drawing Sheets

LIGHT EMITTING DEVICE WITH PHOSPHOR WAVELENGTH CONVERSION

CLAIM OF PRIORITY

This application is a continuation of U.S. patent application Ser. No. 11/975,130 filed Oct. 17, 2007, titled "Light Emitting Device with Phosphor Wavelength Conversion", by Yi-Qun Li, which application is hereby incorporated by reference.

BACKGROUND OF THE INVENTION

1. Field of the Invention

The invention relates to light emitting devices with phosphor wavelength conversion. More specifically, the present embodiments are directed to light emitting diode based lighting systems with phosphor, photo-luminescent, wavelength conversion to generate a desired color and/or color temperature of light.

2. Description of the Related Art

The development of solid state semiconductor devices, in particular light emitting diodes (LEDs), has opened up the possibility of a new generation of energy efficient lighting systems. It was not until LEDs emitting in the blue/ultraviolet part of the electromagnetic spectrum were developed that it became practical to develop white light sources based on LEDs ("white LEDs").

As taught for example in U.S. Pat. No. 5,998,925, white LEDs include one or more phosphor materials, that is photo-luminescent materials, which absorb a portion of the radiation emitted by the LED chip and re-emit light of a different color (wavelength). Typically, the LED chip or die generates blue light and the phosphor(s) absorb a percentage of the blue light and re-emit yellow light or a combination of green and red light, green and yellow light or yellow and red light. The portion of the blue light generated by the LED that is not absorbed by the phosphor (that is the portion transmitted by the phosphor) is combined with the light emitted by the phosphor and provides light which appears to the human eye as being nearly white in color. Phosphor layers are typically placed, for example, adjacent or in close proximity to a light emitting surface of the LED die/chip from which they derive their excitation energy. Often, the phosphor layer is coated directly onto the LED die to achieve the desired intensity and color of illumination product.

As is known, the correlated color temperature (CCT) of a white light source is determined by comparing its hue with a theoretical, heated black-body radiator. CCT is specified in Kelvin (K) and corresponds to the temperature of the black-body radiator which radiates the same hue of white light as the light source. The CCT of a white LED is generally determined by the phosphor composition and the quantity of phosphor incorporated in the LED.

Today, most lighting fixture designs utilizing LEDs comprise systems in which an LED (more typically an LED array to achieve a desired intensity of generated light) replaces conventional system components such as incandescent bulbs, mercury vapor and compact fluorescent lamps. In the case of lighting systems intended to generate a white light illumination product, the LEDs can comprise an array of red, green and blue direct light generating LEDs (that is LEDs without the inclusion of a wavelength converting phosphor material) or more recently an array of white LEDs.

As disclosed in U.S. Pat. No. 6,350,041, WO 2004/100226 and our co-pending U.S. patent application Ser. Nos. 11/827, 890 and 11/714,464, the phosphor material can be provided remotely from its associated excitation source.

U.S. Pat. No. 6,350,041 teaches a solid state lamp based on an LED which emits radially dispersed light for room illumination and other applications. The lamp comprises a solid state light source such as an LED or laser which transmits light through a separator to a disperser that disperses the light in a desired pattern and/or changes the color of light. In one embodiment, the light source comprises a blue light emitting LED, the separator is a light pipe or fiber optic device and the disperser disperses the light radially and converts some of the blue light to yellow to produce a white light illumination product. The separator spaces the LED a sufficient distance from the disperser such that heat from the LED will not transfer to the disperser when the LED is operated at elevated currents as is necessary for room illumination. Such a lamp can disperse light in many patterns, but is particularly applicable to a radial dispersion of white light for room illumination enabling the lamp to be used as an alternative light source in existing luminaires and lighting fixtures.

Our co-pending U.S. patent application Ser. No. 11/827, 890 filed Jul. 13, 2007, teaches LED lighting/illumination systems/fixtures or luminaires in which the phosphor material is located remotely from its associated excitation source (LED). Light generated by the LED is transported to the phosphor material via a waveguiding medium and provides excitation radiation to the phosphor(s) and/or phosphor layer(s), causing a photo luminescence. The light from the phosphor(s) may comprise the final illumination product, or it may be combined with any visible light from the excitation source (which may occur, for example, in the case of a blue LED as the excitation source). The final illumination product may be white light, or any colored light. The waveguide can be configured to be in the shape of a lighting system such as a hanging lighting fixture, a desk lighting fixture, a floor standing lighting fixture, a desk lamp, track lighting, spot lighting, accent lighting or a lighting panel for incorporation into a suspended ceiling. In the lighting panel configuration, the waveguide is substantially planar in form and has the phosphor provided over the entire light emitting face of the waveguide. Excitation radiation generated by a plurality of LEDs is coupled into one or more edges of the waveguide such as to propagate substantially throughout the waveguide and is then emitted through the light emitting face where at least a part of the excitation radiation excites the phosphor which emits light of a second wavelength. To prevent light being lost through the rear face of the panel a reflecting layer is provided on the rear face of the waveguide, that is the face opposite the light emitting face.

U.S. patent application Ser. No. 11/714,464 filed May 3, 2007, teaches lighting fixtures and systems in which the phosphor is provided on a shade which is located remotely from the excitation source (LED). The shade (optical enclosure) is configured to at least in part surround the LED such that excitation radiation travels, propagates in free-space (that is, it is not guided by an optical medium), a distance of at least one centimeter from the excitation source to the shade. The phosphor can be provided on the inner surface or outer surface of the shade or incorporated within the shade material. In one embodiment the lighting system comprises a bulkhead light which comprises a housing containing one or more LEDs and the shade comprises a front window covering the housing opening. The housing which is made of an opaque material includes reflective inner surfaces for reflecting light towards the shade.

WO 2004/100226 discloses an LED panel lamp comprising an enclosure housing a plurality of UV emitting LEDs and a removable front light emitting panel containing one or more UV excitable phosphor materials. Since a phosphor material generates light that is radiated equally in all directions (isotropic), some of the phosphor generated light will be directed backwards into the enclosure. To prevent such light entering the enclosure and being lost, the front panel includes a coating on its interior surface which is transmissive to the wavelengths of the LED yet reflective to wavelengths produced by the phosphor(s). Moreover, to prevent bleed through of non-converted UV light, the front panel can include a second coating on its exterior surface which is reflective to UV light and transmissive to the light generated by the phosphor(s). The document also describes a lighting system which resembles a standard incandescent light bulb in which one or more phosphor materials are included on the inner surface of the bulb envelope.

While such lighting system designs may have demonstrated properties that are acceptable to some customers—properties such as intensity, color temperature and color perception, for instance—a need exists for a lighting system based on solid-state components of even higher efficiency.

SUMMARY OF THE INVENTION

The present invention arose in an endeavor to provide a light emitting device with phosphor wavelength conversion which, at least in part, overcomes the limitations of the known devices. Embodiments of the present invention are directed to light emitting devices comprising an excitation source, which may for example be an LED or a laser diode, and a light emitting surface that includes one or more phosphor, photo luminescent, materials. Light from the excitation source provides an excitation radiation to the phosphor(s) causing a photo luminescence. The light generated by the phosphor combined with light from the excitation source comprises the illumination product of the device. In contrast to the known devices the light emitting area further comprises one or more areas (window(s)) which do not include phosphor material and which are substantially transparent to both light generated by the phosphor and by the excitation source. Such windows improve the efficiency of the device by maximizing light emitted by the device.

According to the invention a light emitting device comprises: at least one excitation source, such as one or more blue light emitting diodes, which is/are operable to generate excitation light of a first wavelength range and a light emitting surface having at least one phosphor material which absorbs at least a part of the excitation light and emits light of a second wavelength range, wherein light emitted by the device comprises combined light of the first and second wavelength ranges emitted by the light emitting surface, characterized in that the light emitting surface has at least one window area which does not include the at least one phosphor material, said window area being substantially transparent to light of the first and second wavelengths.

The light emitting surface preferably comprises a transparent substrate, such as an acrylic, polycarbonate, polythene or glass material, which is substantially transparent to light of the first and second wavelengths and which has the at least one phosphor material on a surface thereof. The phosphor material can comprise an array (pattern) of phosphor regions (islands) in which the gaps between phosphor regions defines the at least one window area. To ensure a uniform color and/or color temperature of emitted light the pattern of phosphor regions is distributed, preferably substantially uniformly, over substantially the entire area of the light emitting surface.

In one such an arrangement, in which the array of phosphor regions comprises a regular array of square phosphor regions, the window area will be grid-like in form and is distributed over the light emitting surface. The phosphor regions can, for example, be substantially polygonal, square, circular, elliptical, triangular or rectangular in shape. Conversely, the phosphor material can cover the entire light emitting surface and include an array of window areas. To ensure a uniform color and/or color temperature of emitted light the pattern of window areas regions is distributed, preferably substantially uniformly, over substantially the entire area of the light emitting surface. As with the phosphor regions the window areas can, for example, be substantially polygonal, square, circular, elliptical, triangular or rectangular in shape. The array of phosphor regions and/or window areas can be a regular or irregular pattern.

The substrate can be configured as an optical component through which the excitation light and phosphor generated light passes. Alternatively, the substrate can be configured as a waveguiding (light-guiding) medium and the excitation source configured to couple excitation light into the substrate. In one such arrangement the substrate is substantially planar in form and the excitation light is coupled into at least a part of one edge of the substrate. Preferably, the device further comprises a reflector on at least a part of the surface of the substrate opposite to the light emitting surface to help ensure that substantially all light is emitted from the light emitting surface. To promote the emission of light from the light emitting surface, the light emitting surface of the substrate can include a surface topology, such as a surface patterning. The surface topology can be defined by laser or mechanical scribing the substrate surface, molding the substrate to include the surface topology or roughening the surface. The substrate can comprise other waveguide forms such as being elongate or cylindrical in form, with the light emitting surface being a substantially flat face or curved surface of the waveguide.

Where it is required to generate light of a particular color and/or CCT, the light emitting surface preferably comprises a pattern of at least two different phosphor materials. The phosphor compositions, density of phosphor material and the relative total areas of the phosphor materials and window area(s) can be used to control the color and/or CCT of the emitted light.

For a light emitting device which is intended to generate white light with a high CRI (color rendering index), the device can further comprise one or more LEDs which is/are operable to generate light of a third wavelength range which contributes to light emitted by the device by the light emitting surface. In one arrangement, blue LEDs are used to excite a green emitting phosphor material and orange or red LEDs used to generate orange or red light components of the final emission product. It will be appreciated that in such an arrangement the emission product comprises red (R), green (G) and blue (B) color components. Preferably, the ratio of blue LEDs to orange or red LED chips is substantially two-to-one to ensure that the green light contribution is sufficient to achieve a required CRI. It will be appreciated that in such an arrangement light generated by the orange or red LEDs does not result in excitation of the phosphor and such light is emitted through the one or more window areas in the light emitting phosphor surface. In an alternative arrangement blue LEDs can be used to excite an orange or red emitting phosphor and one or more green emitting LED chips used to contribute green light to the emission product.

The phosphor material can comprise: a silicate-based phosphor; an aluminate-based phosphor; a nitride-based phosphor material; a sulfate-based phosphor material; an oxy-nitride-based phosphor; an oxy-sulfate-based phosphor; a garnet material; a silicate-based phosphor of a general composition $A_3Si(OD)_5$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S); a silicate-based phosphor of a general composition $A_2Si(OD)_4$ in which A comprises Sr, Ba, Mg or Ca and D comprises Cl, F, N or S; or an aluminate-based phosphor of formula $M_{1-x}Eu_xAl_yO_{[1+3y/2]}$ in which M is at least one of a divalent metal comprising Ba, Sr, Ca, Mg, Mn, Zn, Cu, Cd, Sm or thulium (Tm).

According to a further aspect of the invention a light emitting device comprises: an enclosure having a reflecting inner surface; at least one excitation source housed within the enclosure and operable to generate excitation light of a first wavelength range; and a light emitting surface covering the opening of the enclosure and having at least one phosphor material which absorbs at least a part of the excitation light and emits light of a second wavelength range, wherein light emitted by the device comprises combined light of the first and second wavelength ranges emitted by the light emitting surface, characterized in that the light emitting surface has at least one area which does not include the at least one phosphor material, said area being substantially transparent to light of the first and second wavelengths thereby allowing a part of excitation light and reflected phosphor generated light to pass through the light emitting surface.

BRIEF DESCRIPTION OF THE DRAWINGS

In order that the present invention is better understood embodiments of the invention will now be described, by way of example only, with reference to the accompanying drawings in which.

DETAILED DESCRIPTION OF THE INVENTION

Figure 1:
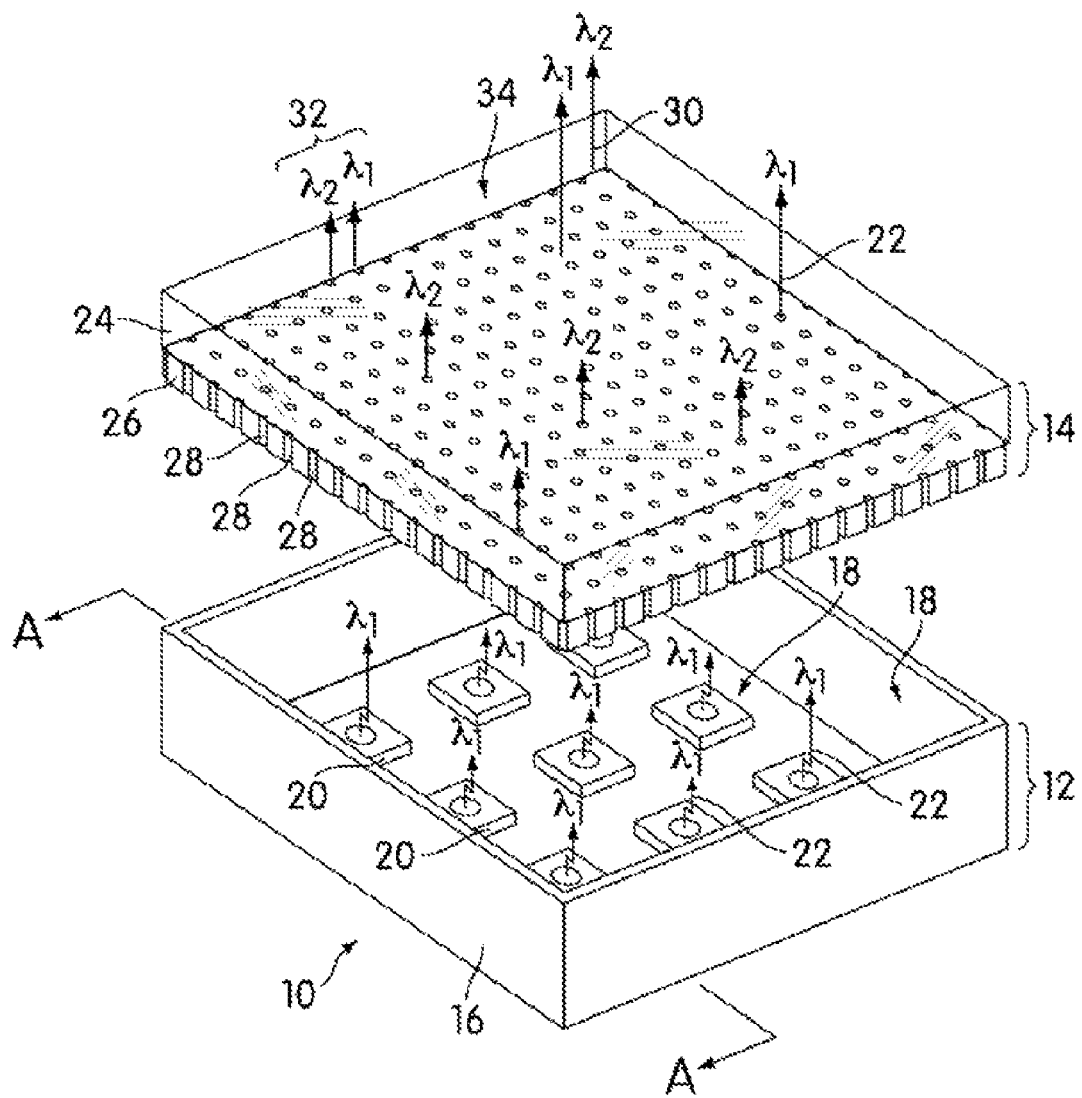
FIG. 1 is a partially exploded perspective schematic representation of a backlit lighting panel in accordance with the invention.
Figure 2:
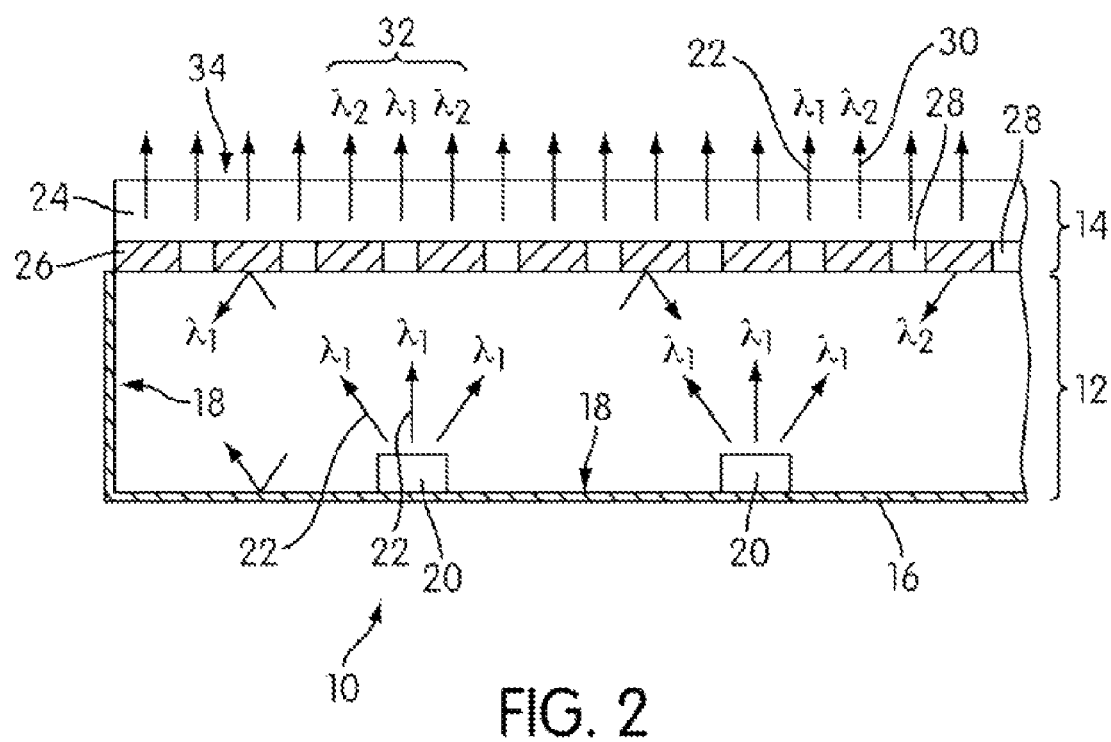
FIG. 2 is a schematic cross sectional representation of the backlit lighting panel of FIG. 1 through a plane AA.

FIGS. 1 and 2 are respectively perspective and cross sectional schematic representations of a white light emitting lighting panel 10 in accordance with the invention. The lighting panel 10 is intended for use in a suspended (drop) ceiling of a type commonly used in offices and commercial premises in which a grid of support members (T bars) are suspended from the ceiling by cables and ceiling tiles/lighting panels are supported by the grid of support members. Typically, the ceiling tiles are square (2 feet×2 feet, 60 cm×60 cm) or rectangular (4 feet×2 feet, 120 cm×60 cm) in shape and the lighting panel of the invention is configured to fit within such an aperture.

The lighting panel 10 comprises a backlighting unit 12 and a light emitting phosphor panel 14. The backlighting unit 12 comprises a light box 16 which is fabricated from, for example, sheet metal, molded from a plastics material or constructed from any other suitable material. To maximize light emission from the lighting panel, the inner surfaces 18 of the light box 16 preferably comprise light reflecting surfaces to reflect light towards the light emitting panel 14. An array of light emitting diodes (LEDs) 20 is provided within the light box 16. Each LED 20 is operable to generate light 22 of wavelength $\lambda_1$ and each preferably comprises an InGaN/GaN (indium gallium nitride/gallium nitride) based LED chip which generates blue light of wavelength 400 to 480 nm. A square array of nine LED chips 20 is illustrated though it will be appreciated that the number and layout of the LEDs can be modified to suit a required application. As will be described the light 22 generated by the LEDs 20 provides two functions; firstly it comprises a part of the final illumination product 32 and secondly it provides excitation radiation for exciting the phosphor material of the phosphor panel 14. In view of the latter function the light 22 will hereinafter be referred to as excitation light.

The light emitting phosphor panel 14 comprises a transparent substrate 24, such as for example an acrylic sheet, having a layer of phosphor material (photo-luminescent material) 26, provided on an under surface, that is the surface of the substrate facing the LEDs. In other arrangements the transparent substrate 24 can comprise other transparent materials such as for example a polycarbonate, polythene, or glass. The phosphor material 26 can comprise any photo-luminescent material which is capable of being excited by the excitation light 22 such as for example, silicate, ortho-silicate, nitride, oxy-nitride, sulfate, oxy-sulfate, garnet or aluminate based phosphor materials. In preferred embodiments the phosphor material is a silicate-based phosphor of a general composition $A_3Si(OD)_5$ or $A_2Si(OD)_4$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S). Examples of silicate-based phosphors are disclosed in our co-pending patent applications US2006/0145123, US2006/028122, US2006/261309, US2007029526 and Ser. No. 11/786,044, filed Apr. 9, 2007 the content of each of which is hereby incorporated by way of reference thereto.

As taught in US2006/0145123, a europium ($Eu^{2+}$) activated silicate-based green phosphor has the general formula $(Sr,A_1)_x(Si,A_2)(O,A_3)_{2+x}:Eu^{2+}$ in which: $A_1$ is at least one of a 2+ cation, a combination of 1+ and 3+ cations such as for example Mg, Ca, Ba, zinc (Zn), sodium (Na), lithium (Li), bismuth (Bi), yttrium (Y) or cerium (Ce); $A_2$ is a 3+, 4+ or 5+ cation such as for example boron (B), aluminum (Al), gallium (Ga), carbon (C), germanium (Ge), N or phosphorus (P); and $A_3$ is a 1−, 2− or 3− anion such as for example F, Cl, bromine (Br), N or S. The formula is written to indicate that the $A_1$ cation replaces Sr; the $A_2$ cation replaces Si and the $A_3$ anion replaces O. The value of x is an integer or non-integer between 2.5 and 3.5.

US2006/028122 discloses a silicate-based yellow-green phosphor having a formula $A_2SiO_4:Eu^{2+}D$, where A is at least one of a divalent metal comprising Sr, Ca, Ba, Mg, Zn or cadmium (Cd); and D is a dopant comprising F, Cl, Br, iodine (I), P, S and N. The dopant D can be present in the phosphor in an amount ranging from about 0.01 to 20 mole percent. The phosphor can comprise $(Sr_{1-x-y}Ba_xM_y)SiO_4:Eu^{2+}F$ in which M comprises Ca, Mg, Zn or Cd.

US2006/261309 teaches a two phase silicate-based phosphor having a first phase with a crystal structure substantially the same as that of $(M1)_2SiO_4$; and a second phase with a crystal structure substantially the same as that of $(M2)_3SiO_5$ in which M1 and M2 each comprise Sr, Ba, Mg, Ca or Zn. At least one phase is activated with divalent europium ($Eu^{2+}$) and at least one of the phases contains a dopant D comprising F, Cl, Br, S or N. It is believed that at least some of the dopant atoms are located on oxygen atom lattice sites of the host silicate crystal.

US2007/029526 discloses a silicate-based orange phosphor having the formula $(Sr_{1-x}M_x)_yEu_zSiO_5$ in which M is at least one of a divalent metal comprising Ba, Mg, Ca or Zn; $0<x<0.5$; $2.6<y<3.3$; and $0.001<z<0.5$. The phosphor is configured to emit visible light having a peak emission wavelength greater than about 565 nm.

Ser. No. 11/786,044 teaches an orange-red phosphor of general formula $(A_1A_2)_3(SiB_1)(OC_1)_5$ in which $A_1$ and $A_2$ each comprise Sr, Ba, Mg, Ca, Zn, Y, lanthanum (La), praseodymium (Pr), samarium (Sm) or Bi, $B_1$ comprises Al, B, P or Ge and $C_1$ comprises F, Cl, Br, S or N.

The phosphor can also comprise an aluminate-based material such as is taught in our co-pending patent applications US2006/0158090 and US2006/0027786 the content of each of which is hereby incorporated by way of reference thereto.

US2006/0158090 teaches an aluminate-based green phosphor of formula $M_{1-x}Eu_xAl_yO_{[1+3y/2]}$ in which M is at least one of a divalent metal comprising Ba, Sr, Ca, Mg, Mn, Zn, Cu, Cd, Sm and thulium (Tm) and in which $0.1<x<0.9$ and $0.5\leq y\leq 12$.

US2006/0027786 discloses an aluminate-based phosphor having the formula $(M_{1-x}Eu_x)_{2-z}Mg_zAl_yO_{[1+3y/2]}$ in which M is at least one of a divalent metal of Ba or Sr. In one composition the phosphor is configured to absorb radiation in a wavelength ranging from about 280 nm to 420 nm, and to emit visible light having a wavelength ranging from about 420 nm to 560 nm and $0.05<x<0.5$ or $0.2<x<0.5$; $3\leq y\leq 12$ and $0.8\leq z\leq 1.2$. The phosphor can be further doped with a halogen dopant H such as Cl, Br or I and be of general composition $(M_{1-x}Eu_x)_{2-z}Mg_zAl_yO_{[1+3y/2]}:H$.

It will be appreciated that the phosphor is not limited to the examples described herein and can comprise any inorganic phosphor material including for example nitride and sulfate phosphor materials, oxy-nitrides and oxy-sulfate phosphors or garnet materials.

Figure 3:
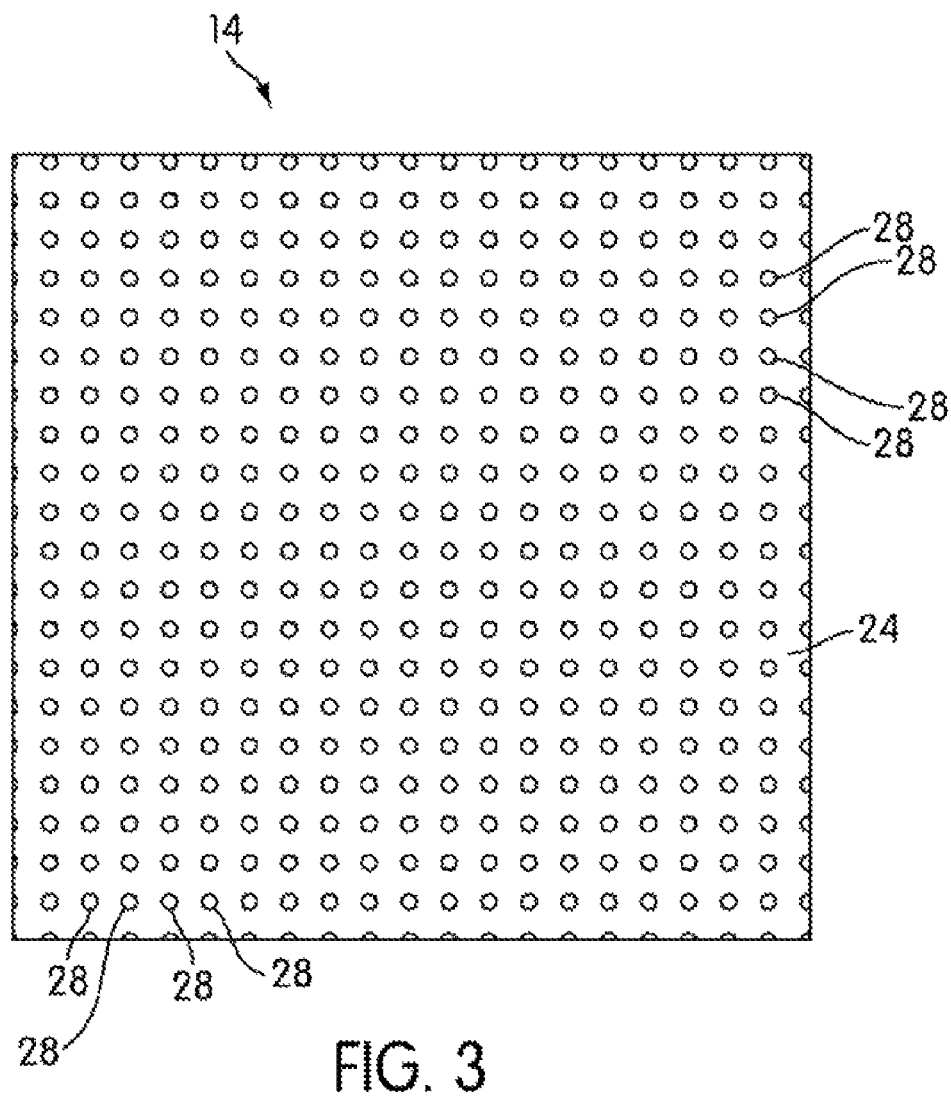
FIG. 3 is a light emitting phosphor panel in accordance with the invention for use in the lighting panel of FIGS. 1 and 2.

FIG. 3 is a plan view of the light emitting phosphor panel 14. In the embodiment illustrated the phosphor layer 26 comprises a uniform layer of phosphor material over the entire surface of the panel and has a regular array (pattern) of circular areas 28 which do not include phosphor material. The circular areas 28 constitute an array or pattern of windows or apertures within the light emitting phosphor panel 14. The light emitting phosphor panel 14 can be fabricated by screen printing a mixture of the phosphor material and a binder, such as NAZDAR's clear screen ink 9700, onto the surface of the transparent substrate 24. It will be appreciated that the phosphor pattern can be produced by other deposition methods such as spraying, ink jet printing and so forth. To protect the phosphor pattern 26 the panel 14 can be mounted to the backlighting unit 12 with the phosphor pattern 26 facing the LEDs 20. In other arrangements the light emitting phosphor panel can further include a transparent protective layer or film (not shown) over the phosphor layer.

The lighting panel 10 of FIGS. 1 and 2 is configured to generate cool white (CW) light having a correlated color temperature (CCT) of $\approx 7000K$ and the phosphor material 26 can comprise, for example, a silicate-based green light emitting phosphor material which generates light of wavelength $\lambda_2\approx 500$ to 540 nm, a garnet or silicate-based yellow light emitting phosphor which generates light of wavelength $\lambda_2\approx 540$ to 580 nm, a mixture of silicate-based green and orange light emitting phosphors or a mixture of a silicate-based green and nitride-based red light emitting phosphors. In operation, excitation light 22 emitted by the LEDs 20 irradiates the light emitting phosphor panel 14. The phosphor material 26 absorbs a proportion of the excitation light 22 causing excitation of the phosphor which re-emits green light 30 of wavelength $\lambda_2$. Light 32 emitted from the upper face (light emitting surface) 34 of the panel, which comprises the final illumination product, is a combination of green light ($\lambda_2$) generated by the phosphor and blue excitation light ($\lambda_1$) not absorbed by the phosphor and this will appear to the human eye as being white in color. The proportion of blue excitation light 22 absorbed by the phosphor will depend on the density of phosphor material per unit area and the thickness of the phosphor layer 26. Due to the isotropic nature of phosphor luminescence this implies that the phosphor will emit about fifty percent of its radiation in a direction back into the lighting panel. Such light will be reflected by the reflecting inner surfaces 18 of the light box back towards the light emitting surface 34 of the panel. Since the windows 28 are transparent to light ($\lambda_1$) emitted by the LEDs and light ($\lambda_2$) generated by the phosphor, the windows allow both blue and green light to be emitted from the lighting panel. An advantage of the light emitting device of the invention is an enhanced light output and hence improved efficiency over the known arrangements. A further advantage of the invention is that since the phosphor material is provided over a relatively large area compared to an LED which incorporates a phosphor, this prevents thermal degradation of the phosphor material.

Figure 4A:
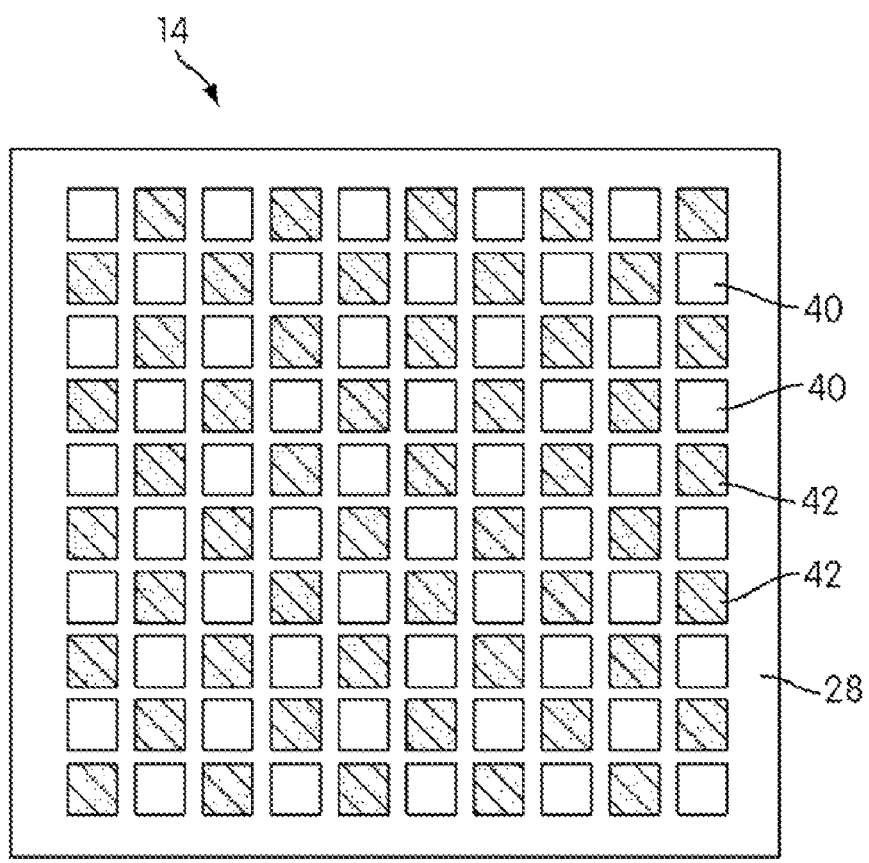
FIGS. 4a and 4b are light emitting phosphor panels in accordance with further embodiments of the invention.
Figure 4B:
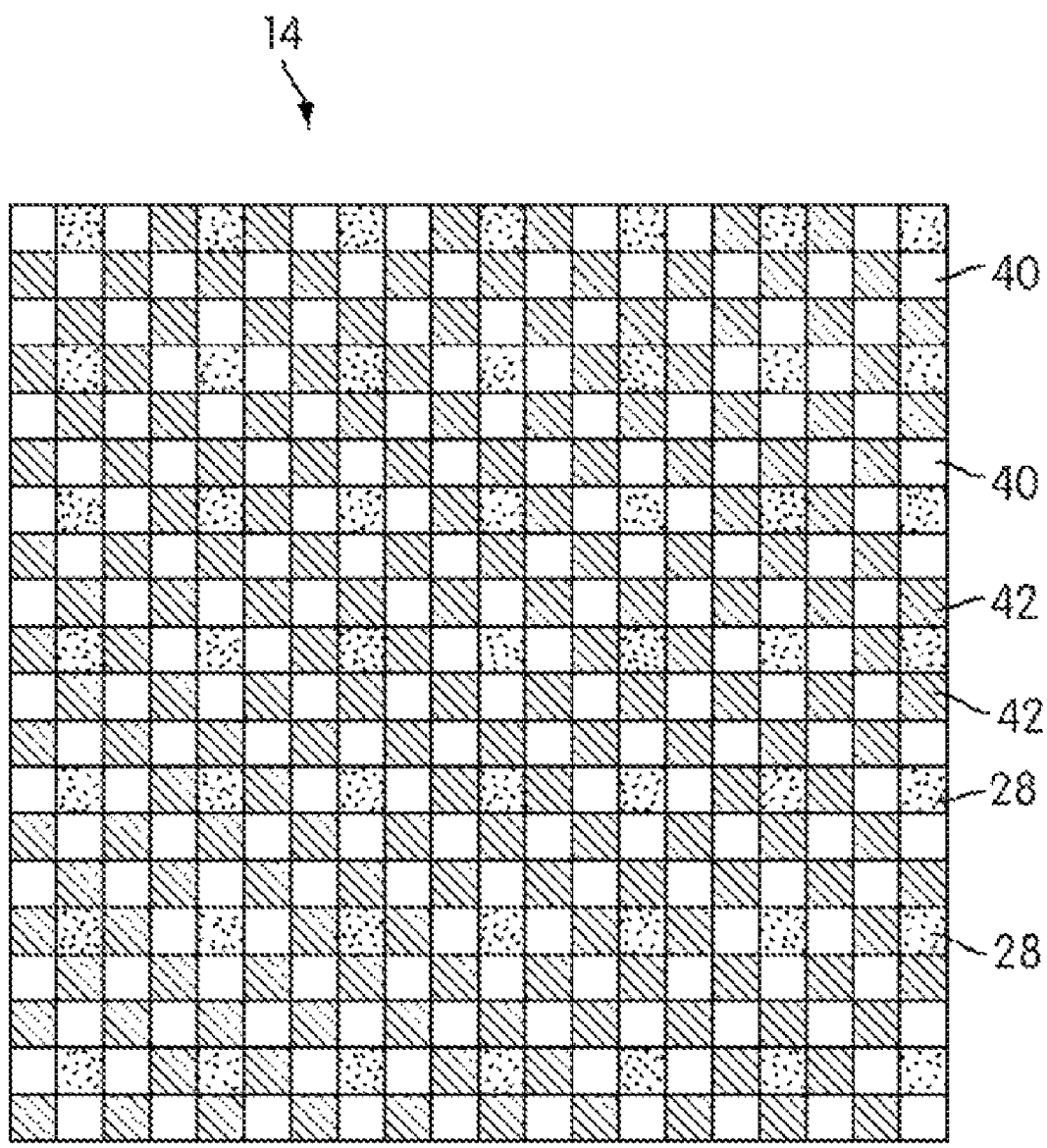

FIGS. 4a and 4b are light emitting phosphor panels 14 in accordance with further embodiments of the invention. In these embodiments the phosphor comprises a pattern of two different phosphor materials. For a lighting panel which is to generate a white light of a selected CCT the phosphor material can comprise for example silicate-based green ($\approx 500$ to 540 nm) and orange ($\approx 575$ to 610 nm) emissive phosphors. In a preferred arrangement the phosphor panel comprises a pattern of green and red light emitting phosphors.

In FIG. 4a the phosphor pattern comprises a regular (square) array of spaced square regions of alternating phosphor materials with the green phosphor regions 40 being indicated by solid squares and the orange phosphor regions indicated 42 by cross hatched squares. All of the area between the square islands of phosphor material, that is the area containing no phosphor material, comprises a window 28 which is grid-like in form and is evenly distributed over the entire surface area of the panel. The phosphor pattern can be screen printed by mixing the powdered phosphor materials with a clear screen ink or clear paint. Typically the weight loading of phosphor in the deposited material is between 10 and 30% though it can range between 1 and 99% depending on the desired illumination product. To deposit a sufficient density of phosphor material per unit area, for example $\approx 0.02$-$0.04$ g/cm$^2$, it may be necessary to make multiple print passes (4-12 passes), the number of passes depending on the mesh size of the printing screen. An advantage of the phosphor pattern of FIG. 4a is that since the phosphor regions are spaced apart, this prevents any possible interaction between the different phoshor material during fabrication of the panel.

In an alternative embodiment, which is intended to generate light with an improved color rendering index (CRI), the orange light emitting phosphor is replaced by a red light emitting phosphor. However, due to the lower efficiency of red phosphors there may be a trade off in terms of the brightness of light emitted by the panel.

In FIG. 4b the phosphor pattern comprises a regular array of square regions, a checkered (checkerboard) pattern, of the two phosphor materials in which the green phosphor regions 40 are indicated by solid squares, the orange phosphor regions 42 by cross hatched squares and the transparent window regions 28 (that is, regions containing no phosphor material) by outlined squares. In contrast to the embodiment of FIG. 4a the corners of the phosphor regions abutt one another. As illustrated there are about twice as many green and orange phosphor regions as there are window regions. Conveniently, the phosphor pattern is screen printed on a transparent substrate though it will be appreciated that any suitable deposition technique can be used. Other phosphor patterns will be apparent to those skilled in the art and will depend on the desired illumination product and can include, for example, window regions and/or phosphor regions that are polygonal, triangular, rectangular, hexagonal, or irregular in shape. Moreover, the window regions and/or phosphor regions can comprise regular or irregular patterns. The concentration of the phosphor in the ink or paint, the thickness and relative areas of the different phosphor regions and the area and geometry of the window region(s) can be optimized to achieve the highest light output efficiency for a desired color of emitted light. For example, in other embodiments each phosphor region can be configured to absorb 100% of the excitation light. Moreover it will be appreciated that in order to generate a substantially uniform illumination product the window and phosphor regions should be substantially evenly distributed over the light emitting surface of the panel.

In alternative embodiments a surface topology of the transparent substrate 24 can be used to define the phosphor pattern. In one arrangement the surface topology defines an array of recesses for receiving the one or more phosphor materials. In such an arrangement the transparent substrate is fabricated by precision molding and a pre-selected volume of phosphor/binder mixture dispensed into each recess using for example a nano liter size plunger type dispenser head as made by Asymtek. Moreover, the light emitting surface 34 of the light emitting panel can additionally include a surface topology defining one or more optical components such as an array of lenses or a lens structure. Such a structure can again be fabricated by precision molding of the transparent substrate.

Figure 5:
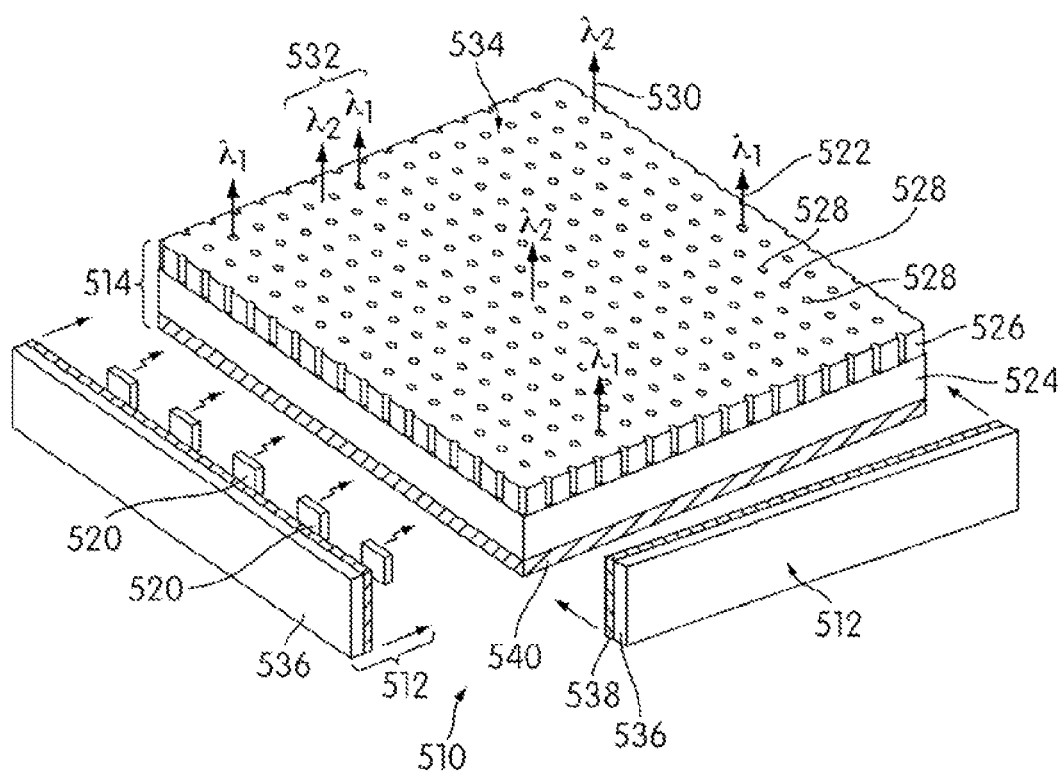
FIG. 5 is a partially exploded perspective schematic representation of an edge-lit lighting panel in accordance with the invention.
Figure 6A:
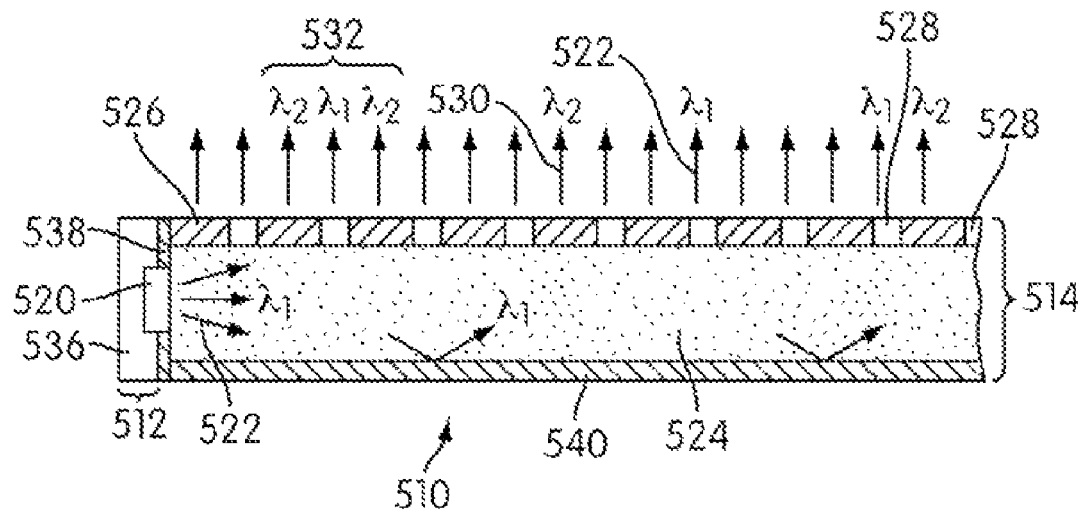
FIG. 6a is a schematic cross sectional representation of the edge-lit lighting panel of FIG. 5.

FIGS. 5 and 6a are respectively perspective and cross sectional schematic representations of an edge-lit white light emitting lighting panel 510 in accordance with a further embodiment of the invention. In this specification like reference numerals preceded by the first figure number corresponding to a given embodiment are used to denote like parts. For example the light emitting phosphor panel 14 of FIG. 1 is denoted 514 in FIGS. 5 and 6a.

In this embodiment the light emitting phosphor panel 514 acts as a waveguiding (light guiding) medium and guides excitation light 522 from LEDs 520 of edge-lighting units 512. The light emitting phosphor panel 514 comprises a planar sheet 524 of transparent material, such as an acrylic material which is dimensioned such that the lighting panel, including the edge-lighting units 512 around the peripheral edge of the panel, will fit into a tile aperture of a standard suspended ceiling. Each edge-lighting unit 512 comprises a linear array of blue emitting LED chips 520 which are mounted along the length of a lighting bar 536. The lighting bar 536 provides electrical connection to the LED chips 520 and thermal management of the chips by conducting heat to the outer surface of the lighting bar which can include a series of heat radiating fins (not shown) to assist in the radiation of heat from the lighting panel. The inner surface of the lighting bar 536, that is the surface facing the edge of the transparent waveguide 524, can include a reflecting surface 538 to prevent light escaping from the edge of the planar waveguide 524. Alternatively, the edges of the waveguide 524 can include a reflecting surface to minimize the escape of light from the edges. In the example illustrated, edge-lighting units 512 are provided along two orthogonal edges though in other embodiments they can be provided along one, two, three or all edges of the planar waveguide sheet 524. On the light emitting surface 534 of the waveguide 524 (this is the upper face as illustrated) there is a layer of phosphor material 526 having an array of window areas 528. On the lower face of the waveguide 524, that is the face directed toward the supporting ceiling, there is a layer of highly reflective material 540 to ensure that substantially all light is emitted from the light emitting face 534 of the light emitting phosphor panel 514.

In operation, excitation light 522 generated by the LED chips 520, which is of a first wavelength range $\lambda_1$, is coupled into the planar waveguide 524 and is guided over the entire surface of the waveguide 524. Light which is emitted through the upper face (light emitting surface) either passes through a window 528 in the phosphor pattern or causes excitation of the phosphor material which re-emits light 530 of a second, longer wavelength range $\lambda_2$. Light 532 emitted from the upper face of the light emitting phosphor panel 514 which comprises the final illumination product is a combination of the excitation light 522 and the light 530 emitted by the phosphor. Typically, the illumination product will be white light and the phosphor layer can comprise green (500 to 540 nm) or orange (580 to 620 nm) emissive phosphors or a combination of phosphor materials which are activated by the blue excitation light. The correlated color temperature (CCT) of light produced by the panel 510 can be selected by the proportion of the light emitting panel's surface area that comprises window areas compared to phosphor areas and the quantity, thickness and composition of phosphor material(s). In other arrangements the panel can be configured to produce colored light by appropriate selection of the phosphor material, thickness and pattern.

The light emitting surface 534 of the waveguide 524 can additionally include a surface topology defining one or more optical components, such as an array of lenses or lens structure, to enhance (promote) light emission and/or emission angle from the light emitting surface. In one arrangement the surface of the waveguide 524 is laser scribed with a complimentary pattern before the phosphor pattern is deposited. In an alternative arrangement, the waveguide can be precision molded to include an array of lenses or other optical features to encourage the emission of light out of the emitting face of the waveguide. Alternatively, the surface of the waveguide can include a roughening of the surface or a regular patterning of the surface.

Figure 6B:
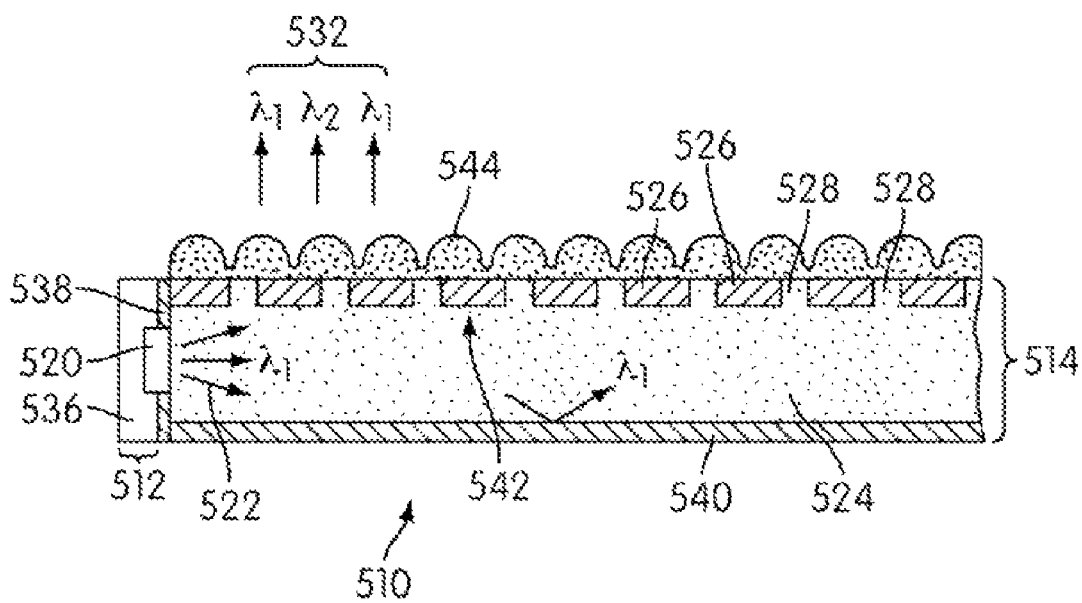
FIG. 6b is a schematic cross sectional representation of an edge-lit lighting panel in accordance with a further aspect of the invention.

In other arrangements, as illustrated in FIG. 6b, a waveguide surface topology can be used to define the phosphor/window pattern as well as promoting the emission of light from the light emitting surface of the waveguide. In the arrangement shown, the light emitting surface 534 of the planar waveguide 524 includes an array of shallow recesses 542 for receiving the phosphor material 526. The light emitting phosphor panel 514 can be fabricated by precision molding the transparent substrate 524 and then dispensing a pre-selected volume of phosphor/binder mixture into each recess using for example a nano liter size plunger type dispenser head as made by Asymtek. Alternatively, a phosphor/binder mixture can be washed over the entire light emitting surface of the waveguide and the surface then wiped with a flexible blade or roller (squeegee) to wipe away surplus phosphor material such that phosphor material remains in the recesses only. Additionally, the light emitting phosphor panel 514 can include an array of lenses 544 or other optical components to focus or otherwise direct the light emission 532 of the lighting panel.

An advantage of the edge-lit lighting panel of the invention is the compact nature, especially overall thickness, of the panel which can be the same as the thickness of the light emitting phosphor panel 514 (that is ≈5-10 mm).

Although the lighting panel 510 is described as being for use in a suspended ceiling it can also be used on a wall, flush with a ceiling, as a part of a floor or any horizontal surface such as a counter top or other planar surface such as stair treads or risers. Moreover, the panel can be used as a part of a structural component of a building or piece of furniture. In the case of stair treads or risers the waveguide preferably comprises a laminated glass construction with the phosphor pattern being incorporated within one of the intervening laminations. In addition to flat panel lighting it will be appreciated that the light emitting panel can be fabricated as a curved surface or other forms as desired.

Figure 7:
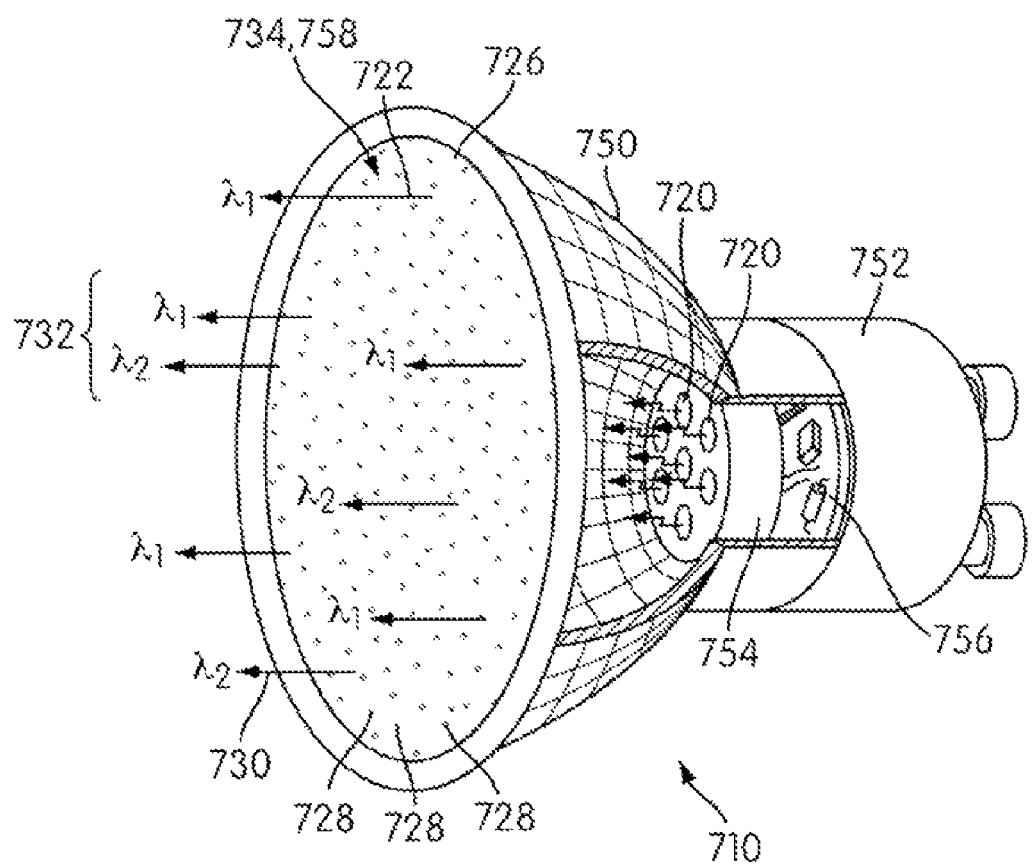
FIG. 7 is a partial cut-away perspective representation of a reflector lamp in accordance with the invention.

FIG. 7 is a partial cut-away perspective representation of a reflector lamp 710 in accordance with a further embodiment of the invention and is intended as a direct replacement to a conventional MR16 type halogen reflector lamp. The lamp 710 comprises a hemi-spherical reflector 750 with a GU10 base 752 and is intended for mains operation 110-240V AC. It will be appreciated that other reflector configurations and/or bases can be used such as for example GU4, GU5.3, GX5.3, GY4 and GZ4 reflector lamp bases. In the reflector lamp 710 of the invention, the halogen bulb is replaced by an array of blue emitting LED chips 720 mounted on a heat sink 754. Driver circuitry 756 is housed within the base to enable the LED chips to be operated directly from a mains supply.

The reflector lamp 710 further comprises a front cover 758 which covers the opening of the reflector 750. The front cover 758, which constitutes the light emitting surface 734 of the lamp, comprises a transparent sheet, such as for example an acrylic sheet, having a layer of phosphor material 726 on its inner face, that is the face facing the LED chips. The phosphor layer (pattern) 726 includes a regular array (pattern) of windows 728 which do not include any phosphor material. Due to the isotropic nature of phosphor luminescence, light 732 emitted by the lamp will not have a precisely defined beam pattern in spite of the presence reflector 750. To collimate and/or direct the emitted light in a desired direction the front cover 758 can be formed as a lens and/or include a lens structure on its outer surface. In one arrangement a Fresnel lens is defined on the outer surface of the cover by for example precision molding the front cover. As in other embodiments, a surface topology of a surface (preferably the inner surface) of the front cover 756 can be used to define the phosphor and/or window pattern.

Figure 8:
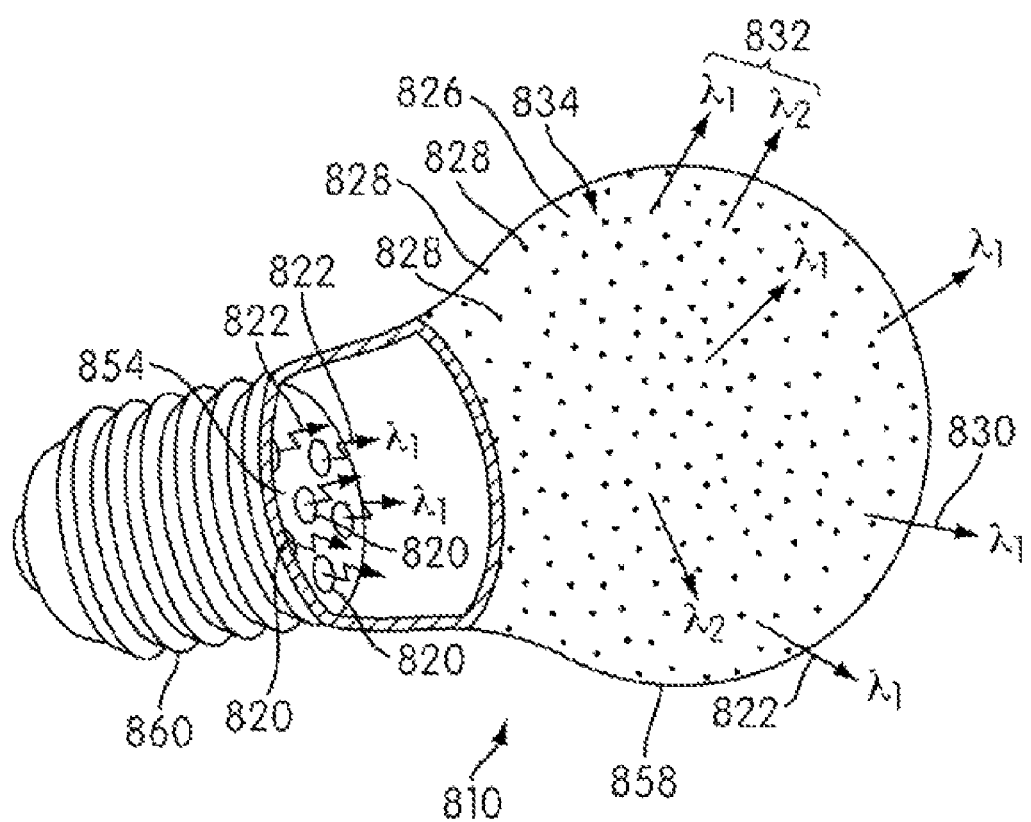
FIG. 8 is a partial cut-away perspective representation of a light bulb in accordance with the invention.

FIG. 8 is a partial cut-away perspective representation of a light bulb 810 in accordance with the invention which is intended as a direct replacement for a conventional incandescent light bulb. The bulb 810, which is intended for mains operation 110-240V AC, comprises a transparent envelope 850 and an E26 standard base (screw connector) 860. It will be appreciated that other envelope shapes and/or connectors can be used such as, for example, a bayonet connector. In the bulb 810 of the invention the tungsten filament arrangement is replaced by an array of blue emitting LED chips 820 mounted on a heat sink 854. Driver circuitry (not shown) is housed within the screw connector 860 to enable the LED chips to be operated directly from a mains supply.

The envelope 858, which constitutes the light emitting surface 834 of the bulb, preferably comprises a transparent plastics material such as an acrylic and has a layer of phosphor material 826 over its entire surface. The phosphor layer 826 includes a pattern (array) of windows 828 which do not include any phosphor material. The phosphor layer can be provided on the inner or outer surfaces of the envelope, though the former is preferred for ease of fabrication. Since the phosphor material is more easily provided on the outer surface of the envelope, the bulb preferably further includes a transparent outer protective layer (not shown) covering the phosphor layer.

Figure 9:
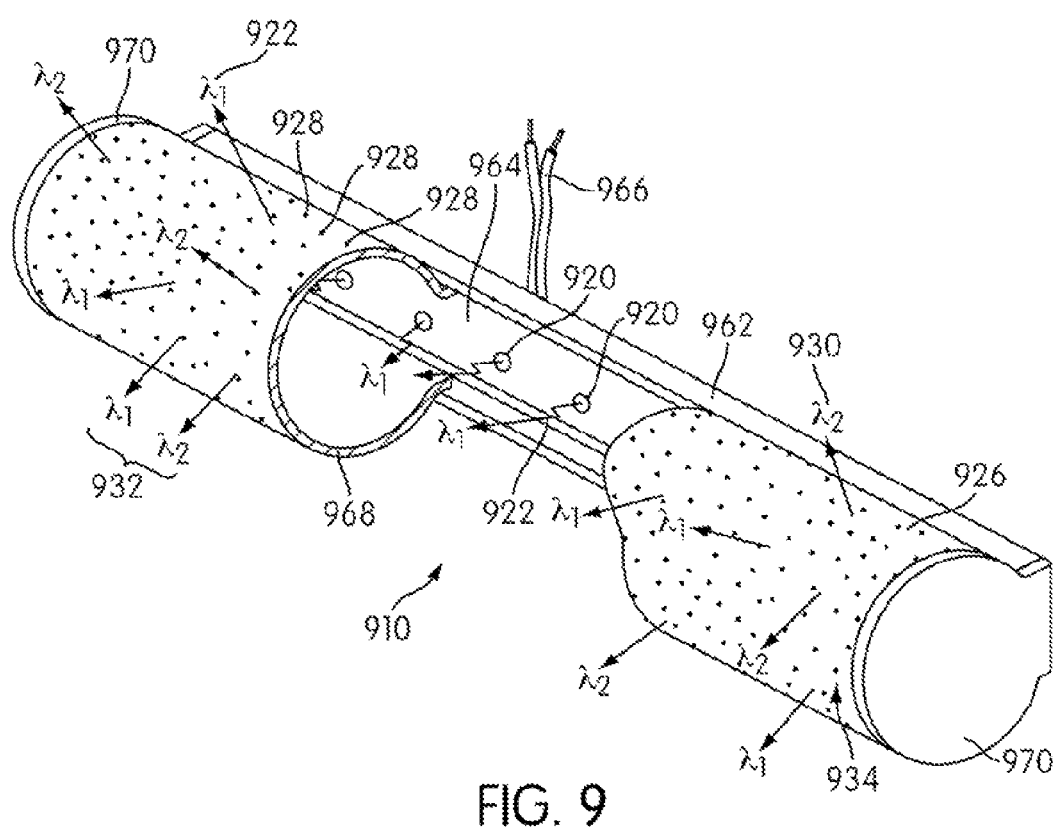
FIG. 9 is a partial cut-away perspective schematic representation of a tubular lamp in accordance with the invention.

FIG. 9 is a partial cut-away perspective schematic representation of a tubular lamp 910 in accordance with a further embodiment of the invention. The lamp 910 can be used to replace a conventional tubular incandescent bulb or can be used as an alternative to a fluorescent tube and is intended for mains operation 110-240V AC. In this embodiment the lamp 910 is elongate in form and comprises an elongate enclosure 962 which houses a lighting bar 964 comprising a linear array of blue LED chips 920. The LED chips 920 are equally spaced along the length of the lighting bar 964 to provide a substantially uniform illumination within the enclosure. The lighting bar 964 and enclosure 962 can be made of a thermally conducting material (metal or metal loaded epoxy/silicone) and are preferably in thermal communication with each other to conduct heat generated by the LED chips 920 out of the rear of the lamp. The rear of the enclosure can further include a series of heat radiating fins (not shown) to assist in the effective dissipation of heat. Driver circuitry (not shown) is housed within the enclosure to enable the LED chips to be operated directly from a mains supply via connecting leads 966.

The light emitting surface 934 of the lamp 910 comprises a generally tubular transparent cover 950 having an opening running along its length and is made of a transparent plastics material such as an acrylic. The cover has a layer of phosphor material 926 over its entire surface and includes a pattern of windows 928 which do not include any phosphor material. The open edges of the cover 968 are mounted in the enclosure 962 and opaque end caps 970 cover the open ends of the cover to prevent light escaping from the ends of the lamp.

It will be appreciated that the present invention is not restricted to the specific embodiments described and that variations can be made that are within the scope of the invention. Embodiments of the invention are directed to light emitting devices and lighting systems having a light emitting surface which includes one or more phosphor materials and one or more window areas to allow the emission of excitation light and phosphor generated light.

The arrangement and relative ratio of the phosphor regions and/or window areas can be selected to achieve a desired color and/or color temperature of emitted light. To ensure generation of a substantially uniform color illumination product over the entire area of the light emitting surface, the window areas and/or phosphor regions should be substantially uniformly distributed over the light emitting surface. The light emitting surface can be configured as a light transmitting or a waveguiding optical arrangement. In one arrangement the light emitting surface comprises a transparent film on which a pattern of phosphor material is deposited. Such a film can then be applied to the light emitting surface of existing optical components.

To further enhance color uniformity of emitted light the device can further include a light diffusing layer, which can for example comprise a transparent material carrying light scattering particles such as silicon dioxide.

Moreover, whilst in the examples described a single color LED (preferably blue) is used both as a phosphor excitation source and to contribute light to the emission product, it is envisaged in further embodiments to use a combination of two or more different color LEDs and one or more phosphor materials to generate the required light emission product. For example, in one arrangement which is intended to generate white light with a high CRI (color rendering index), blue LED chips are used to excite a green phosphor material and orange or red LED chips used to generate orange or red light components of the final emission product. In such an arrangement the emission product comprises red (R), green (G) and blue (B) color components. Preferably, the ratio of blue LEDs to orange and/or red LED chips is substantially two-to-one to ensure that the green light contribution is sufficient to achieve a required CRI. It will be appreciated that in such an arrangement light generated by the orange and/or red LEDs does not result in excitation of the phosphor and such light is emitted through the one or more windows in the light emitting phosphor surface. In an alternative arrangement blue LEDs can be used to excite an orange or red emitting phosphor and one or more green emitting LED chips used to contribute green light to the emission product.

What is claimed is:

1. A light emitting device comprising:
   at least one light source that generates excited radiation in a first wavelength;
   a light transmissive substrate associated with the at least one light source, wherein the light transmissive substrate is configured as a light guiding medium that operates to guide the excited radiation from the at least one light source to a light emitting surface;
   at least one phosphor material disposed as a layer adjacent to the light emitting surface with a plurality of window areas; and
   wherein the at least one light source is configured to couple excitation radiation into the substrate such that it waveguided within the substrate by total internal reflection;
   wherein the light emitted by the device from the light emitting surface comprises first wavelength radiation and second, longer, wavelength photoluminescent light emitted by the phosphor layer as a result of excitation by the source.

2. The light emitting device of claim 1, wherein the substrate is selected from the group consisting of being: substantially planar, elongate and cylindrical.

3. The light emitting device of claim 1, wherein the window areas are defined by the gaps between the phosphor material regions.

4. The light emitting device of claim 1, wherein the phosphor material regions are selected from the group consisting of being: substantially square, substantially circular, substantially elliptical, substantially triangular, substantially rectangular, substantially polygonal and combinations thereof.

5. The light emitting device of claim 1, wherein the pattern of phosphor material regions is deposited on the waveguide by a process selected from the group consisting of: screen printing, spraying and inkjet printing.

6. The light emitting device of claim 1, wherein the layer of phosphor material comprises a pattern of at least two different phosphor materials.

7. The light emitting device of claim 1, wherein the window areas are selected from the group consisting of being: substantially square, substantially circular, substantially elliptical, substantially triangular, substantially rectangular, substantially polygonal and combinations thereof.

8. The light emitting device of claim 1, wherein the light emitting surface of the substrate further includes a surface topology configured to promote the emission of light from the light emitting surface.

9. The light emitting device of claim 1, wherein the at least one phosphor material is selected from the group consisting of a silicate-based phosphor, an aluminate-based phosphor, a nitride-based phosphor, a sulfate-based material, an oxy-nitride based material, and a garnet-based material.

10. The light emitting device of claim 1, wherein the second, longer wavelength photoluminescent light emitted by the phosphor material layer is selected from the group consisting of green, yellow, orange, and red light.

11. The light emitting device of claim 1, wherein the substrate is selected from the group consisting of an acrylic, a polycarbonate, a polythene and a glass.

12. The light emitting device of claim 1, wherein the at least one excitation source comprises an array of blue light emitting LEDs.

13. The light emitting device of claim 1, and further comprising at least one source of red light that is configured to couple red light into the substrate.

14. The light emitting device of claim 1, wherein the layer of phosphor materials comprises a pattern of different phosphor material regions, and each phosphor material region is disposed with only one type of phosphor material.

15. The light emitting device of claim 14, wherein the pattern of different phosphor material regions comprises a regular array of spaced square regions of alternating phosphor materials.

16. The light emitting device of claim 14, wherein the phosphor pattern is a checkerboard pattern that comprises a regular array of spaced square regions of two phosphor materials and transparent window regions.

17. The light emitting device of claim 16, wherein there are at least twice as many phosphor regions as the transparent window regions.

* * * * *